United States Patent [19]

Ishikawa et al.

[11] Patent Number: 5,258,866
[45] Date of Patent: Nov. 2, 1993

[54] METHOD OF CONNECTING LIQUID CRYSTAL DISPLAY AND CIRCUIT BOARD WITH THERMAL EXPANSION COMPENSATION

[75] Inventors: Takehiro Ishikawa; Takao Tanaka; Humihiko Sagawa, all of Iwaki, Japan

[73] Assignee: Alps Electric Co., Ltd., Tokyo, Japan

[21] Appl. No.: 850,327

[22] Filed: Mar. 10, 1992

[30] Foreign Application Priority Data

Mar. 18, 1991 [JP] Japan .................. 3-077281

[51] Int. Cl.$^5$ ........................................... G02F 1/1343
[52] U.S. Cl. ........................................ 359/88; 359/87
[58] Field of Search ................ 359/54, 88, 78, 83, 359/56; 361/398, 400, 425; 174/254; 357/65, 70; 156/359; 29/840, 841; 257/747, 778, 786

[56] References Cited

U.S. PATENT DOCUMENTS

| | | | |
|---|---|---|---|
| 4,836,651 | 6/1989 | Anderson . | |
| 4,999,484 | 3/1991 | Kaneko | 257/53 |
| 5,019,201 | 5/1991 | Yabu et al. | 156/273.9 |
| 5,042,919 | 8/1991 | Yabu et al. | 359/88 |
| 5,063,286 | 11/1991 | Kaneko | 250/208.1 |
| 5,084,961 | 2/1992 | Yoshikawa | 29/840 |
| 5,139,972 | 8/1992 | Neugebauer et al. | 437/205 |
| 5,189,539 | 2/1993 | Suzuki | 359/87 |
| 5,212,576 | 5/1993 | Yoshioka | 359/88 |

FOREIGN PATENT DOCUMENTS 0003126 1/1986 Japan .
64-007631 1/1989 Japan .
0235746 2/1990 Japan .

OTHER PUBLICATIONS

Kaneko, Liquid Crystal Displays, KTK Scientific Publishers, 1987.

Primary Examiner—William L. Sikes
Assistant Examiner—Kenneth Parker
Attorney, Agent, or Firm—Guy W. Shoup; Norman R. Klivans

[57] ABSTRACT

A method of connecting a liquid crystal display element and a flexible circuit board to each other by which electrode terminals of the flexible circuit board and lead terminals of the flexible circuit board are registered accurately with each other after connection. According to this method, the terminal pitch of the electrode terminals of the liquid crystal display element is represented by P, the terminal pitch of the lead electrodes before a pressurizing and heating step is represented by p, and the elongation percentage of a base film of the flexible circuit board by the pressurizing and heating step is represented by $\alpha$, either one of the terminal pitches P and p is set in advance relative such that the relationship of $P=(1+\alpha)p$ may be satisfied.

4 Claims, 2 Drawing Sheets

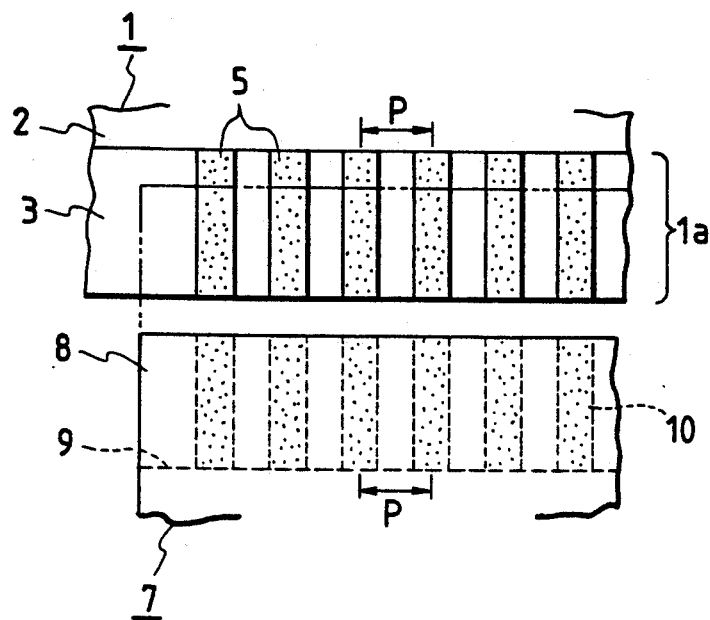
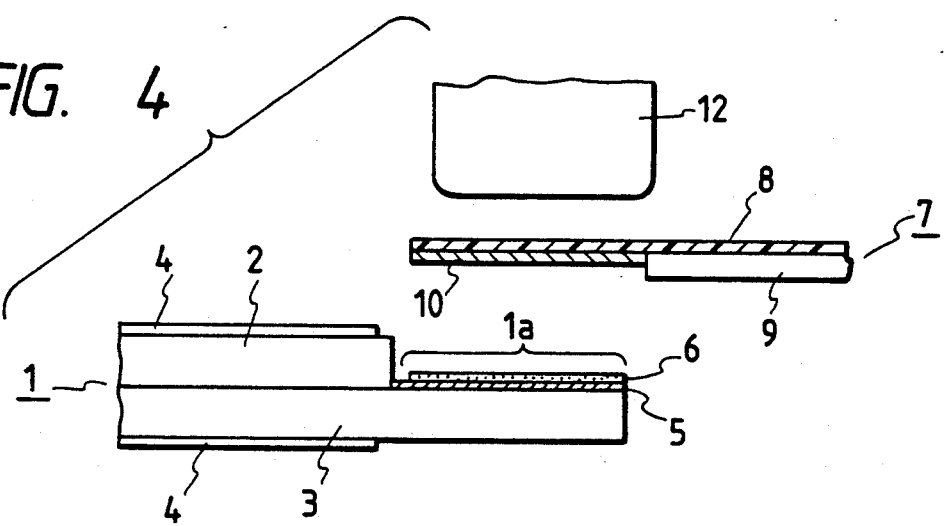

METHOD OF CONNECTING LIQUID CRYSTAL DISPLAY AND CIRCUIT BOARD WITH THERMAL EXPANSION COMPENSATION

BACKGROUND OF THE INVENTION

1. Field of the Invention

This invention relates to a connecting method for a structure for connecting electrode terminals of a liquid crystal display element and lead terminals of a flexible circuit board to each other by a pressuring and heating step.

2. Description of the Related Art

A flexible circuit board is normally connected to terminals of a liquid crystal display element by pressurizing and heating them using a heater chip or the like with a conducting bonding material such as an anisotropic conducting sheet interposed between them.

FIG. 2 shows a liquid crystal display element to which a plurality of flexible circuit boards are connected; FIG. 3 illustrates a positioning step upon connection of a flexible circuit board to the liquid crystal display element; and FIG. 4 illustrates a pressurizing and heating step for connecting the flexible circuit board to the liquid crystal display element.

Referring to FIGS. 2 to 4, the liquid crystal display unit generally denoted at 1 includes an upper glass substrate 2, a lower glass substrate 3, liquid crystal (not shown) enclosed between the two glass substrates 2 and 3, a polarizing plate 4 and so forth. Transparent electrodes (not shown) made of an ITO film or the like are formed in accordance with display patterns on opposing faces of the glass substrates 2 and 3. An end edge of the lower glass substrate 3 is formed as a terminal section 1a on which a large number of electrode terminals 5 for the external connection are formed in a juxtaposed relationship such that they extend individually from the transparent electrodes.

A known anisotropic conducting sheet 6 made of a thermosetting resin in which conducting powder is contained is used in order to establish electric and mechanical connection of two elements on the opposite faces thereof by pressurizing and heating. It is to be noted that such anisotropic conducting sheet is omitted in FIGS. 2 and 3 in order to avoid complexity in illustration.

A flexible circuit board is generally denoted at 7 and is formed by etching copper foil on a base film 8 made of a polyimide film or the like to form a conductor pattern and then coating the conductor pattern with a cover film 9. The conductor pattern is exposed at an end edge of the base film 8 as output lead terminals 10. An electronic part 11 such as an LSI is carried on the flexible circuit board 7.

In order to connect the flexible circuit board 7 to the liquid crystal display element 1, first the anisotropic conducting sheet 6 is placed onto the terminal section 1a of the liquid crystal display element 1, and then the mutually corresponding electrode terminals 5 and lead terminals 10 of the liquid crystal display element 1 and flexible circuit board 7 are positioned relative to each other as seen in FIG. 3. In this instance, a technique is normally employed in which the mutually corresponding electrode terminals 5 and lead terminals 10 are all registered with each other at the positioning stage by setting the terminal pitch p of the lead terminals 10 of the flexible circuit board 7 and the terminal pitch P of the electrode terminals 7 of the liquid crystal display element 1 equal to each other in advance. After the mutually corresponding electrode terminals 5 and lead electrodes 10 are positioned with a high degree of accuracy relative to each other, they are temporarily fixed to each other, and then they are normally fixed to each other by pressurizing and heating the flexible circuit board 7 on the terminal section 1a using a heater chip 12 as seen in FIG. 4 to melt and soften the anisotropic conducting sheet 6 to electrically and mechanically connect the mutually corresponding electrode terminals 5 and lead terminals 10 to each other.

However, in the series of steps described above, even if the electrode terminals 5 and the lead terminals 10 are positioned with a high degree of accuracy relative to each other upon temporary fixation, since the base film 8 of the flexible circuit board 7 is normally elongated a little upon normal fixation (at the pressurizing and heating step), the terminal pitch p of the lead terminals 10 will be a little greater than the terminal pitch P of the electrode terminals 5 after such normal fixation. Consequently, when the number of such terminals is great with a fine pitch, the reliability of the connection may possibly be deteriorated by displacement between the electrode terminals 5 and the lead terminals 10.

SUMMARY OF THE INVENTION

It is an object of the present invention to provide a method of connecting a liquid crystal display element and a flexible circuit board to each other by which electrode terminals of the flexible circuit board and lead terminals of the flexible circuit board are registered accurately with each other after connection of them.

In order to attain the object, according to the present invention, there is provided a method of connecting a liquid crystal display element and a flexible circuit board to each other by performing a pressurizing and heating step to electrically and mechanically connect a plurality of electrode terminals formed at an equal pitch along an end edge of a glass substrate of the liquid crystal display element to a plurality of lead electrodes formed at an equal pitch along an end edge of a base film of the flexible circuit board, wherein, where the terminal pitch of the electrode terminals of the liquid crystal display element is represented by P, the terminal pitch of the lead electrodes before the pressurizing and heating step is represented by p, and the elongation percentage of the base film of the flexible circuit board by the pressurizing and heating step is represented by $\alpha$, either one of the terminal pitches P and p is set in advance relative to the other such that the relationship of $P = (1+\alpha)p$ may be satisfied.

When the elongation percentage of the base film of the flexible circuit board by the pressurizing and heating step is $\alpha$, then the terminal pitch p of the lead terminals at an initial stage will be $(1+\alpha)p$ after the pressurizing and heating step. Accordingly, if the terminal pitch P of the electrode terminals is set in advance to a value which is greater than p by $\alpha p$, then otherwise possible displacement between the electrode terminals and lead terminals can be prevented. Similarly, in case the terminal pitch P of the electrode terminals is fixed decisively, if the terminal pitch p of the lead terminals at an initial stage is set to $P/(1+\alpha)$, then otherwise possible displacement between the electrode terminals and the lead terminals can be prevented.

Thus, with the connecting method, when a terminal pitch of electrode terminals of a liquid crystal display element or lead terminals of a flexible circuit board is to be set, the terminal pitch is corrected taking an elongation percentage of a base film of the flexible circuit board at a pressurizing and heating step into consideration. Accordingly, even where a large number of terminals are involved, mutually corresponding electrode terminals and lead terminals can be connected accurately with certainty to each other. The connecting method thus assures a high degree of reliability particularly in connecting a flexible circuit board to a liquid crystal display element for which terminals of a fine pitch are required.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 3 is a schematic plan view illustrating a positioning step according to a conventional connecting method; and FIG. 4 is a schematic elevational view illustrating a pressurizing and heating step to connect the flexible circuit board to the liquid crystal display element according to the conventional connecting method.

DETAILED DESCRIPTION OF THE PREFERRED EMBODIMENT

Figure 1:
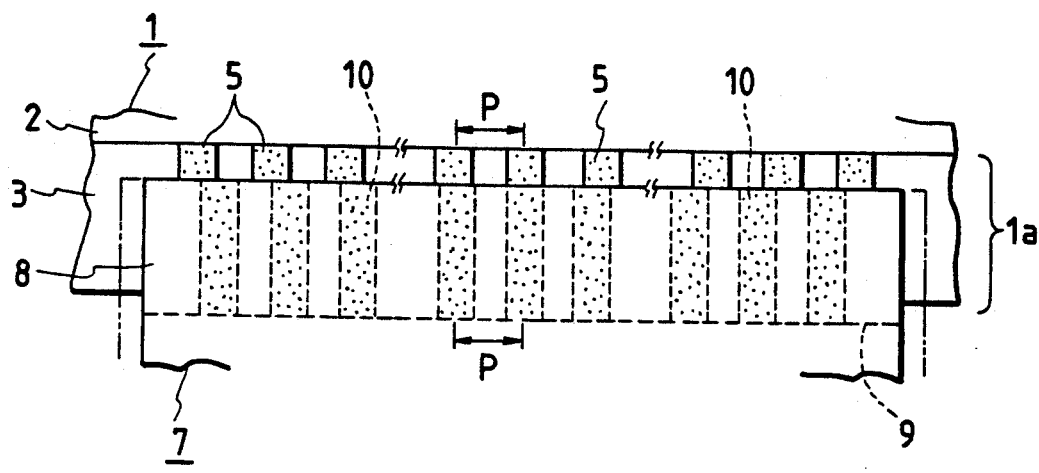
FIG. 1 is a schematic view illustrating a positioning step for connecting a flexible circuit board to a liquid crystal display element according to a connecting method of the present invention.
Figure 2:
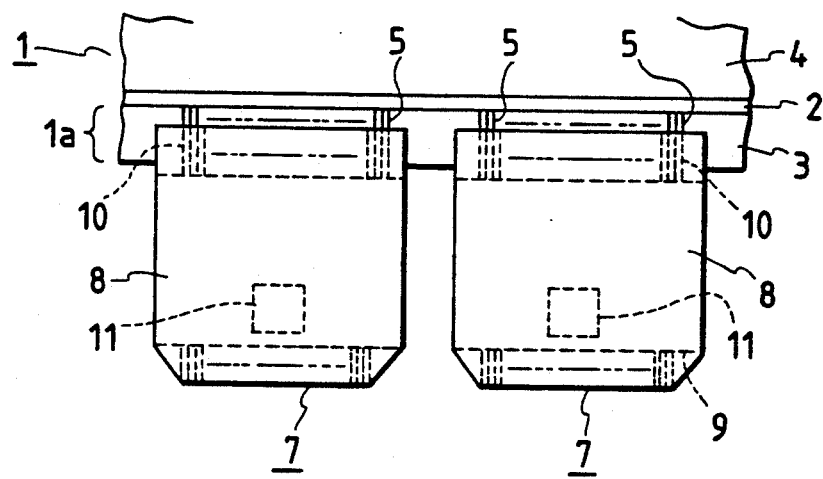
FIG. 2 is a schematic plan view showing a liquid crystal display element to which a pair of flexible circuit boards are connected.

Referring to FIG. 1, there is illustrated a positioning step for connecting a flexible circuit board to a liquid crystal display element according to a connecting method of the present invention. The liquid crystal display element is generally denoted at 1 and has a terminal section 1a. The liquid crystal display element 1 includes an upper glass substrate 2, a lower glass substrate 3, liquid crystal (not shown) enclosed between the two glass substrates 2 and 3, a large number of electrode terminals 5 formed in a juxtaposed relationship on the terminal section 1a, and so forth, similarly to the liquid crystal display element 1 described hereinabove with reference to FIG. 2. The flexible circuit board is generally denoted at 7 and includes a base film 8, a cover film 9, a plurality of lead terminals 10 and so forth similarly to the flexible circuit board 7 described hereinabove with reference to FIG. 2. It is to be noted that an anisotropic conducting sheet applied to the terminal section 1a of the liquid crystal display element 1 is omitted in FIG. 1 in order to avoid complexity in illustration.

According to the present invention, at a positioning step at which the flexible circuit board 7 is temporarily fixed to the terminal section 1a of the liquid crystal display element 1 with an anisotropic conducting sheet interposed therebetween, the terminal pitch P of the electrode terminals 5 of the liquid crystal display element 1 is set a little greater than the terminal pitch p of the lead terminals 10 of the flexible circuit board 7. In particular, taking it into consideration that the base film 8 is elongated upon normal fixation wherein the flexible circuit board 7 on the terminal section 1a of the liquid crystal display element 1 is pressurized and heated using a heater chip not shown (pressurized and heated at the heat chip temperature of 190° C. and the pressure of 30 kgf/cm$^2$ for 20 seconds), where the elongation percentage is represented by $\alpha$, the terminal pitch P of the electrode terminals 5 of the liquid crystal display element 1 is set to the value of $(1+\alpha)p$ in order to prevent otherwise possible displacement between the electrode terminals 5 and the lead terminals 10 of the flexible circuit board 7 after the pressurizing and heating step.

In particular, in the present embodiment, the lead terminals 10 of the flexible circuit board 7 are formed at the pitch of 0.2 mm. Thus, after it is confirmed that the elongation percentage of the base film 8 by a pressurizing and heating step is 0.5%, the terminal pitch P of the electrode terminals 5 of the liquid crystal display element 1 is set to $(1+0.005)\times 0.2=0.201$ mm. Then, at a positioning step, one of the lead terminals 10 of the flexible circuit board 7 which is positioned at the center in the widthwise direction of the flexible circuit board 7 (leftward and rightward direction in FIG. 1) is registered with a corresponding one of the electrode terminals 5 of the liquid crystal display element 1. As a result, those lead terminals 10 which are positioned at the opposite end portions of the flexible circuit board 7 in the widthwise direction are displaced from the respective corresponding lead electrodes 5 as seen from FIG. 1. However, after a pressurizing and heating step is performed, since the base film 8 is elongated by 0.5% by such step, the mutually corresponding electrode terminals 5 and lead terminals 10 are connected to each other in a fully registered condition.

It is to be noted that, alternatively when the terminal pitch P of electrode terminals of a liquid crystal display element is settled decisively, where the elongation percentage of a base film of a flexible circuit board by a pressurizing and heating step is represented by $\alpha$, the terminal pitch p of lead terminals of the flexible circuit board at an initial stage should be set to $p=P/(1+\alpha)$. For example, if P=0.2 mm and $\alpha=0.005$, then the terminal pitch p should be set to $0.2\div 1.005 = 0.199$ mm.

Having now fully described the invention, it will be apparent to one of ordinary skill in the art that many changes and modifications can be made thereto without departing from the spirit and scope of the invention as set forth herein.

What is claimed is:

1. A method for connecting a plurality of electrode terminals formed at an end edge portion of a glass substrate of a liquid crystal display element to a plurality of lead electrodes formed at an end edge portion of a base film of a flexible circuit board by using a pressurizing and heating step, the elongation percentage of the base film of said flexible circuit board caused by the pressurizing and heating step being $\alpha$, said method comprising:

forming said plurality of electrode terminals along the end edge portion of the glass substrate at a first equal pitch P and forming said plurality of lead electrodes along the end edge portion of the base film at an second equal pitch p, said first pitch P and second pitch p satisfying a relationship of $P=(1+\alpha)p$;

coating an anisotropic conducting sheet onto said end edge portion of the glass substrate;

positioning said lead electrodes of the flexible circuit board to said electrode terminals of the liquid crystal display element with a central electrode terminal of the liquid crystal display element being registered with a corresponding central lead electrode of the flexible circuit board; and pressurizing and heating said end edge portions of the glass substrate and the base film to electrically and mechanically connect said plurality of electrode terminals to said plurality of lead electrodes.

2. A method according to claim 1, wherein said first pitch P of said electrode terminals is 0.2 mm and said second pitch p of said lead electrodes is 0.199 mm.

3. A method according to claim 1, wherein $P = 1.005 \, p$ when the heating temperature is about 190° C. and the pressure of the pressurizing force is about 30 kgf/cm$^2$.

4. A method for connecting a plurality of electrode terminals formed at an end edge portion of a glass substrate of a liquid crystal display element to a plurality of lead electrodes formed at an end edge portion of a flexible circuit board by using a pressurizing and heating step, said method comprising:

forming said plurality of lead electrodes along the end portion of the flexible circuit board at a first equal pitch p and;

forming said plurality of electrode terminals along the end edge portion of the glass substrate at a second equal pitch $P = 1.005 \, p$;

coating an anisotropic conducting sheet onto said end edge portion of the glass substrate;

positioning said lead electrodes of the flexible circuit board to said electrode terminals of the liquid crystal display element with a central electrode terminal of the liquid crystal display element being registered with a corresponding central lead electrode of the flexible circuit board; and pressurizing and heating said end edge portions of the glass substrate and the base film to a pressure of about 30 kgf/cm$^2$ and at a temperature of about 190° C. to electrically and mechanically connect said plurality of electrode terminals to said plurality of lead electrodes.

* * * * *